US011150553B2

(12) United States Patent
Jung

(10) Patent No.: US 11,150,553 B2
(45) Date of Patent: Oct. 19, 2021

(54) METHODS OF FORMING IMPRINTED PATTERNS

(71) Applicant: SK hynix Inc., Icheon-si (KR)

(72) Inventor: Wooyung Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 279 days.

(21) Appl. No.: 16/169,686

(22) Filed: Oct. 24, 2018

(65) Prior Publication Data

US 2019/0265586 A1     Aug. 29, 2019

(30) Foreign Application Priority Data

Feb. 23, 2018 (KR) .................. 10-2018-0022155

(51) Int. Cl.
  *G03F 7/00* (2006.01)
  *B29C 35/08* (2006.01)
(52) U.S. Cl.
  CPC ........ *G03F 7/0002* (2013.01); *B29C 35/0888* (2013.01); *G03F 7/0017* (2013.01)
(58) Field of Classification Search
  CPC .................. G03F 7/0002; B29C 35/0888
  See application file for complete search history.

(56) References Cited

U.S. PATENT DOCUMENTS

| 8,202,463 B2 | 6/2012 | Yoneda et al. | |
| 2007/0231981 A1* | 10/2007 | Sreenivasan | B81C 1/0046 438/158 |
| 2009/0115110 A1* | 5/2009 | Schumaker | B82Y 40/00 264/401 |
| 2010/0072647 A1* | 3/2010 | Tokue | B29C 33/424 264/40.1 |
| 2010/0078846 A1* | 4/2010 | Resnick | B82Y 10/00 264/101 |
| 2010/0193994 A1* | 8/2010 | Wuister | B82Y 10/00 264/293 |
| 2010/0286811 A1* | 11/2010 | Jones | B29C 43/003 700/110 |
| 2015/0017329 A1* | 1/2015 | Fletcher | B29C 43/021 427/277 |
| 2015/0221501 A1* | 8/2015 | Tsuji | G03F 7/0002 264/447 |

OTHER PUBLICATIONS

M. Pappenheim, J..Vac. Sci. Technol. B, vol. 34, No. 6 Nov./Dec. 2016; Flat and highly flexible composite stamps for nanoimprint, their preparation and their limits (Year: 2016).*
Chen et.al. Defect control in nanoimprint lithography, 2005 J. Vac. Sci. Techno. B Microelectronics and Nanometer structures Processing, Measurement, and Phenomena vol. 23, 2933 (Year: 2005).*

(Continued)

*Primary Examiner* — Matthew J Daniels
*Assistant Examiner* — Wayne K. Swier
(74) *Attorney, Agent, or Firm* — William Park & Associates Ltd.

(57) ABSTRACT

A method of forming imprinted patterns is provided. The method may include detecting a particle located on a wafer. The method may include distributing an imprint medium material on a surface of the wafer. The method may include forming an imprint medium layer on a surface of the wafer with a template and the imprint medium material.

7 Claims, 9 Drawing Sheets

(56) References Cited

OTHER PUBLICATIONS

Li et al. A sandwiched flexible polymer mold for control of particle-induced defects in nanoimprint lithography, 2013 Appl Phys A: Materials Science & Processing 110:123-128 (Year: 2013).*

Pappenheim, et.al. Flat and high flexible composite stamps for nanoimprint, their preparation and their limits, 2016 J.Vac. Sci. Techno.B vol. 34 No. 6 (Year: 2016).*

* cited by examiner

METHODS OF FORMING IMPRINTED PATTERNS

CROSS-REFERENCE TO RELATED APPLICATIONS

The present application claims priority under 35 U.S.C 119(a) to Korean Application No. 10-2018-0022155, filed on Feb. 23, 2018, which is incorporated herein by references in its entirety.

BACKGROUND

1. Technical Field

Various embodiments of the present disclosure generally relate to nanoimprint lithography (NIL) technologies and, more particularly, to methods of forming imprinted patterns.

2. Related Art

Nanoimprint lithography (NIL) technologies have been proposed to form fine patterns on a wafer. The NIL technologies may correspond to pattern transfer technologies that use an imprint template having nanostructures. The imprint template may be put on an imprint medium layer and the imprint template may be pressed toward the imprint medium layer to transfer a feature of the nanostructures into the imprint medium layer. If particles are generated while the NIL technologies are applied to a wafer, the particles may adhere to a surface of the wafer. Thus, when the imprint template is pressed to the wafer, the particles on the wafer may damage the imprint template, for example, a surface of the imprint template.

SUMMARY

According to an embodiment, there is provided a method of forming imprinted patterns. The method may include detecting a particle located on a wafer. The method may include forming first droplets of an imprint medium material on a surface of the wafer. The method may include forming second droplets of the imprint medium material at positions adjacent to the particle on the surface of the wafer. The method may include spreading the first and second droplets by pressing down a template toward the wafer to form an imprint medium layer.

According to another embodiment, there is provided a method of forming imprinted patterns. The method may include detecting a particle located on a wafer, forming first droplets of an imprint medium material on a surface of the wafer, generating a drop map for forming second droplets of the imprint medium material to be adjacent to the particle on the wafer using information on the detected particle, forming the second droplets of the imprint medium material on the wafer according to the drop map, and spreading the first and second droplets by pressing down a template toward the wafer to form an imprint medium layer.

According to yet another embodiment, there is provided a method of forming imprinted patterns using an imprinting apparatus. The imprinting apparatus may include a template configured to face a wafer, a supplier configured to supply an imprint medium material onto the wafer, and a particle detector configured to detect a particle located on the wafer. The method may include collecting information on a position and a size of the particle located on the wafer, forming first droplets of the imprint medium material on a surface of the wafer using the supplier, forming second droplets of the imprint medium material on the wafer to be adjacent to the particle using the collected information on the particle, and spreading the first and second droplets by pressing down the template toward the wafer to form an imprint medium layer.

According to an embodiment, there is provided a method of forming imprinted patterns. The method may include detecting a particle located on a wafer. The method may include distributing an imprint medium material on a surface of the wafer. The method may include forming an imprint medium layer on a surface of the wafer with a template and the imprint medium material. The imprint medium layer may have a first thickness and a second thickness greater than the first thickness, and the second thickness may be closer in proximity to the particle than the first thickness.

DETAILED DESCRIPTION

Figure 1:
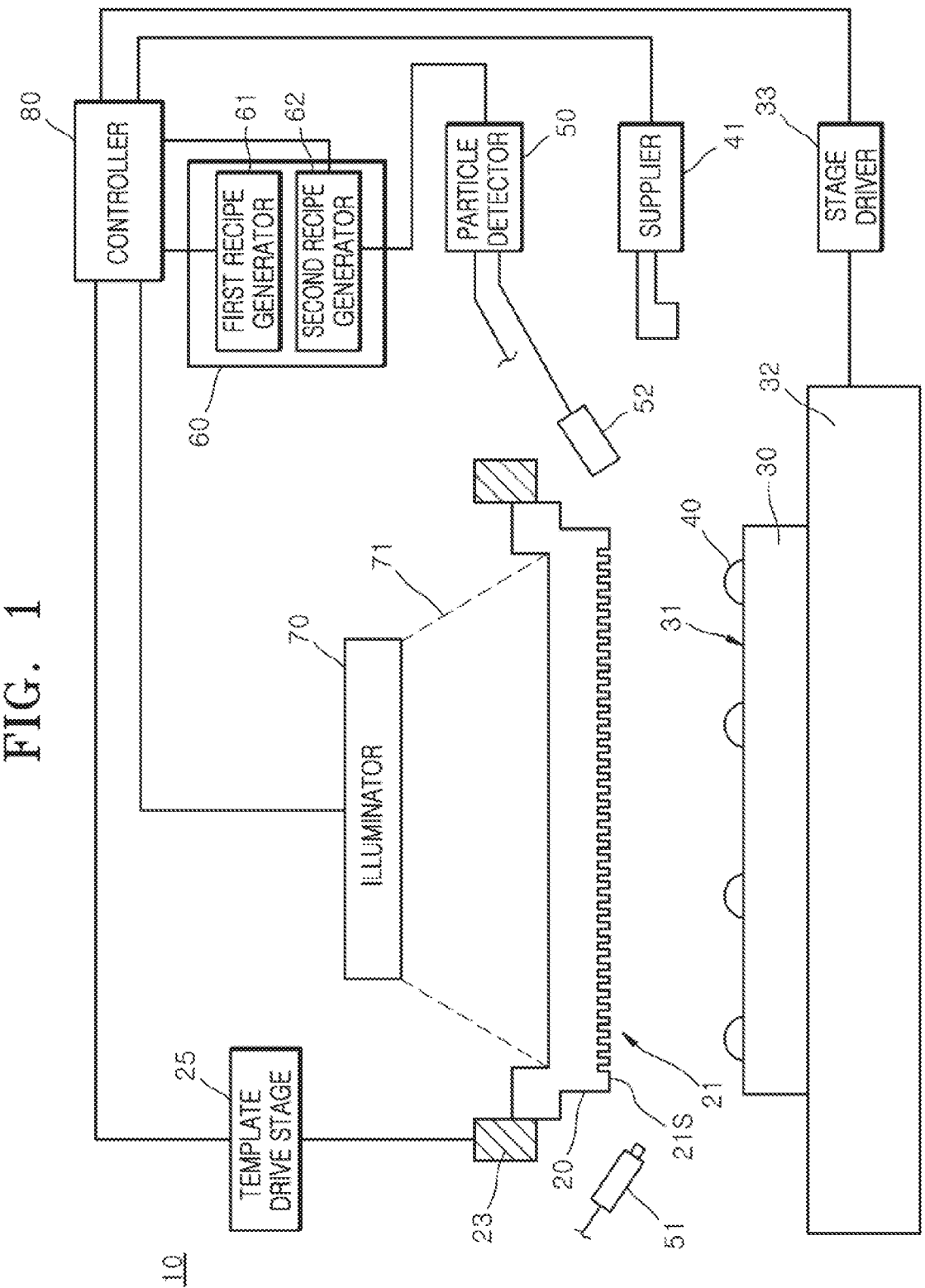
FIG. 1 is a simplified side view illustrating an imprinting apparatus according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong.

It will be understood that although the terms first, second, third etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the concepts.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The following embodiments may be applied to realization of integrated circuits such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated. The following embodiments may also be applied to techniques for realizing various products including fine patterns.

Same reference numerals refer to same elements throughout the specification. Even though a reference numeral is not mentioned or described with reference to a drawing, the reference numeral may be mentioned or described with reference to another drawing. In addition, even though a reference numeral is not illustrated in a drawing, it may be mentioned or described with reference to another drawing.

FIG. 1 schematically illustrates an imprinting apparatus 10 used in formation of imprinted patterns.

Referring to FIG. 1, the imprinting apparatus 10 may be configured to include a template 20 and a wafer stage 32 on which a wafer 30 (or a substrate) is loaded to face the template 20. The template 20 may have a patterned surface 21S providing imprinting patterns 21 which are transferred onto the wafer 30. The imprinting patterns 21 may include recessed portions and protrusions defined by the patterned surface 21S. That is, the imprinting patterns 21 may include concave and convex patterns. The template 20 may be held and handled by a template holder 23. The template holder 23 may be configured to hold and support edges of the template 20.

The imprinting apparatus 10 may further include a template drive stage 25 for supporting and moving the template holder 23. In order to perform an imprinting operation, the template drive stage 25 may move down the template 20 toward the wafer 30, may push or press the template 20 so that the template 20 contacts the wafer 30, and may lift the template 20 to detach the template 20 from the wafer 30. The wafer stage 32 may include a wafer chuck which is configured to retain and support the wafer 30. The wafer 30 may be fixed to the wafer stage 32, and the template 20 may be located over the wafer 30. The wafer stage 32 may be electrically and mechanically connected to a stage driver 33, and the stage driver 33 may move and drive the wafer stage 32.

The imprinting apparatus 10 may further include a supplier 41 for providing droplets 40 of an imprint material or an imprint medium material. The supplier 41 may be configured to include a plurality of nozzles for dropping the droplets 40 on a surface 31 of the wafer 30 using an inkjet manner. The imprint material may include a resist material. The supplier 41 may generate the droplets 40 that are supplied onto the surface 31 of the wafer 30 to be spaced apart from each other by a certain distance. The surface 31 of the wafer 30 may face the imprinting patterns 21 of the template 20, and a feature of the imprinting patterns 21 may be transferred onto the surface 31 of the wafer 30 during an imprinting process.

The imprinting apparatus 10 may further include a recipe generator 60. The recipe generator 60 may provide a recipe about an array pattern of the droplets 40 required during the imprinting process. The recipe generator 60 may set positions of the droplets 40 arrayed on the surface 31 of the wafer 30, a size of the droplets 40, an amount of the droplets 40, and the like. The recipe generator 60 may provide a drop map including an array pattern of the droplets 40 which are formed on the surface 31 of the wafer 30. The supplier 41 may operate so that the droplets 40 are formed on the wafer 30 according to the array pattern of the drop map provided by the recipe generator 60. The drop map may be provided as an imprint drop map for supplying an imprint medium material, for example, a resist material. The recipe generator 60 may be configured to include a first recipe generator 61 that generates the imprint drop map.

The imprinting apparatus 10 may further include an illuminator 70. The illuminator 70 may be configured to provide an exposure light 71 for curing an imprint medium layer to which a feature of the imprinting patterns 21 is transferred. The illuminator 70 may be configured to generate an ultraviolet (UV) ray as the exposure light 71 irradiated onto the wafer 30.

The imprinting apparatus 10 may further include a particle detector 50. The particle detector 50 may be configured to detect particles adhering to the surface 31 of the wafer 30. The particle detector 50 may collect information on the particles adhering to the surface 31 of the wafer 30. For example, the particle detector 50 may collect information on positions of the particles adhering to the surface 31 of the wafer 30 and sizes of the particles on the wafer 30 and may transmit the information on the particles to the recipe generator 60. The recipe generator 60 may further include a second recipe generator 62. The second recipe generator 62 may generate an additional drop map corresponding to an additional recipe for additionally supplying the imprint medium material on the basis of the information on the particles, which is collected by the particle detector 50.

The particle detector 50 may be configured to include a light emitter 51 and a light receiver 52. The light emitter 51 may generate and irradiate a laser beam acting as a detection light onto the surface 31 of the wafer 30 mounted on the wafer stage 32. The light emitter 51 may be configured to include a light source generating a laser beam. The light emitter 51 may be disposed to face the surface 31 of the wafer 30 so that the laser beam generated by the light emitter 51 scans the surface 31 of the wafer 30. The light receiver 52 may be disposed to face the surface 31 of the wafer 30 so that the light receiver 52 collects a light reflecting from the surface 31 of the wafer 30.

The imprinting apparatus 10 may further include a controller 80 that controls operations of various components disposed in the imprinting apparatus 10. The controller 80 may control the template drive stage 25 so that the template 20 performs the imprinting process. The controller 80 may control the stage driver 33 so that the wafer stage 32 operates. The controller 80 may control the illuminator 70 to cure an imprint medium layer on the wafer 30.

The controller 80 may control the supplier 41 using the imprint drop map generated by the first recipe generator 61 as a recipe, thereby forming the droplets 40 on the surface 31 of the wafer 30. The droplets 40 may be arrayed on predetermined positions of the wafer 30 according to the imprint drop map. The controller 80 may control the operation of the particle detector 50 collecting information on the particles. In addition, the controller 80 may control the supplier 41 using the additional drop map generated by the second recipe generator 62 with the particle information as a recipe, thereby forming additional droplets on the surface 31 of the wafer 30. The additional droplets may be arrayed on additional predetermined positions of the wafer 30 according to the additional drop map.

Figure 2:
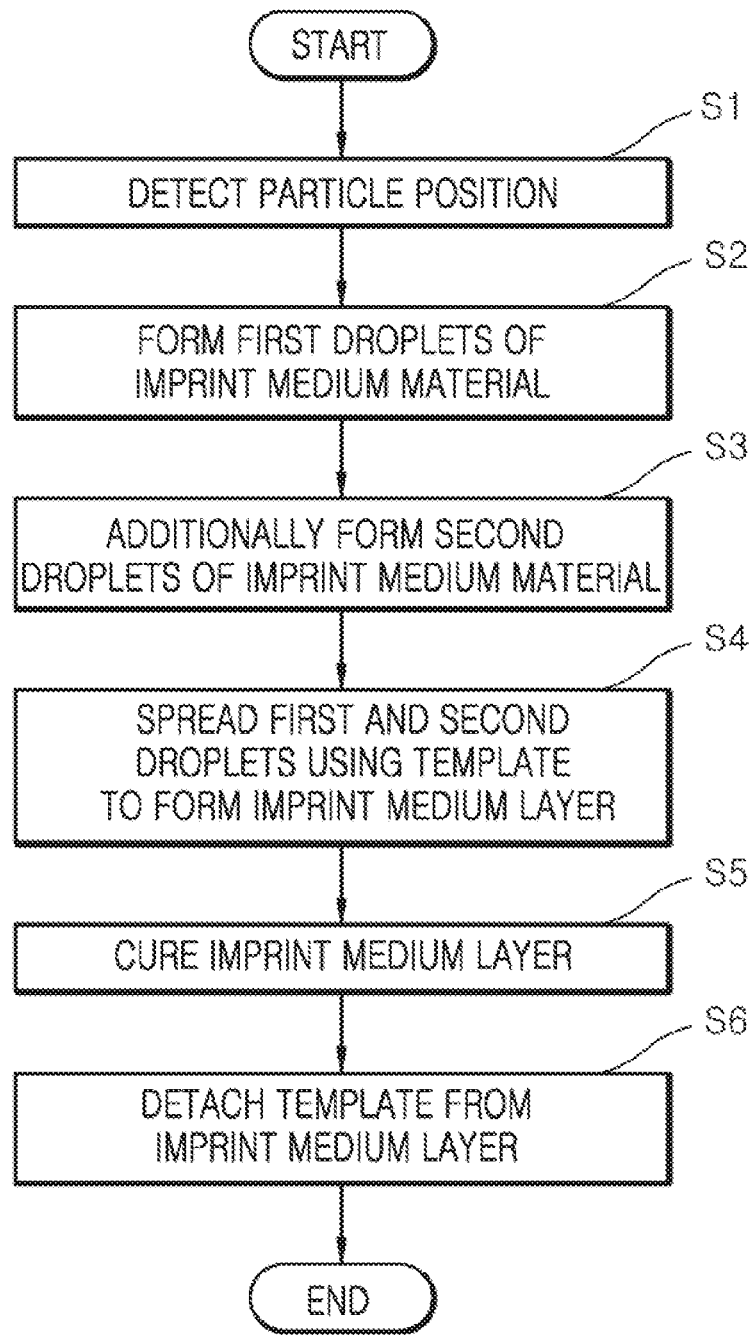
FIG. 2 is a flowchart illustrating a method of forming imprinted patterns according to an embodiment.
Figure 9:
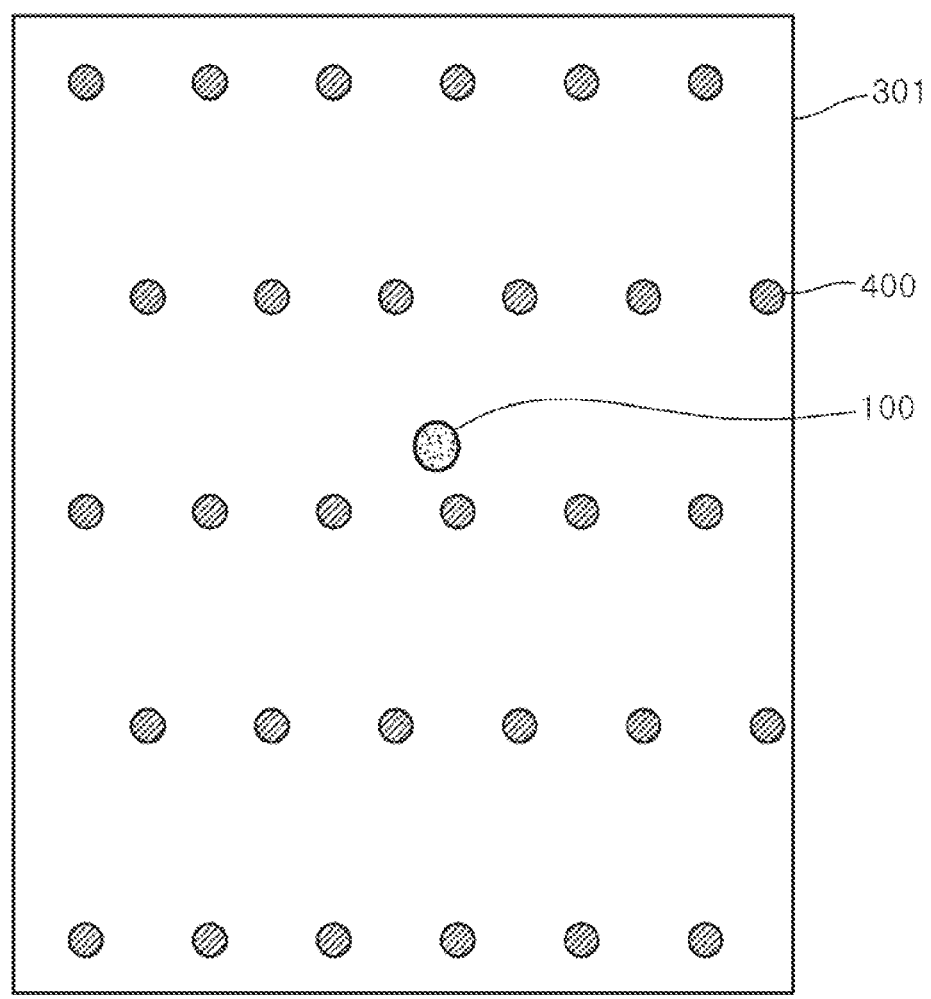
FIGS. 9 to 11 are plan views illustrating various imprint material drop maps.
Figure 10:
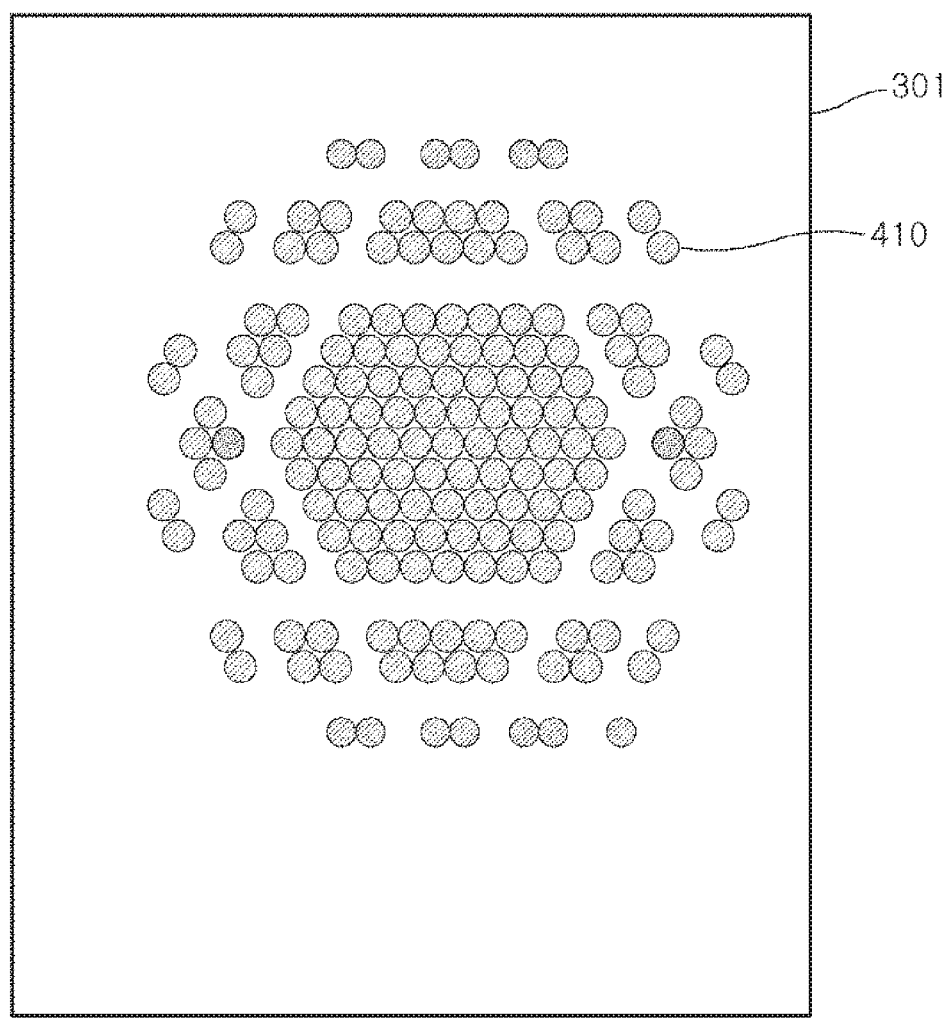
Figure 11:
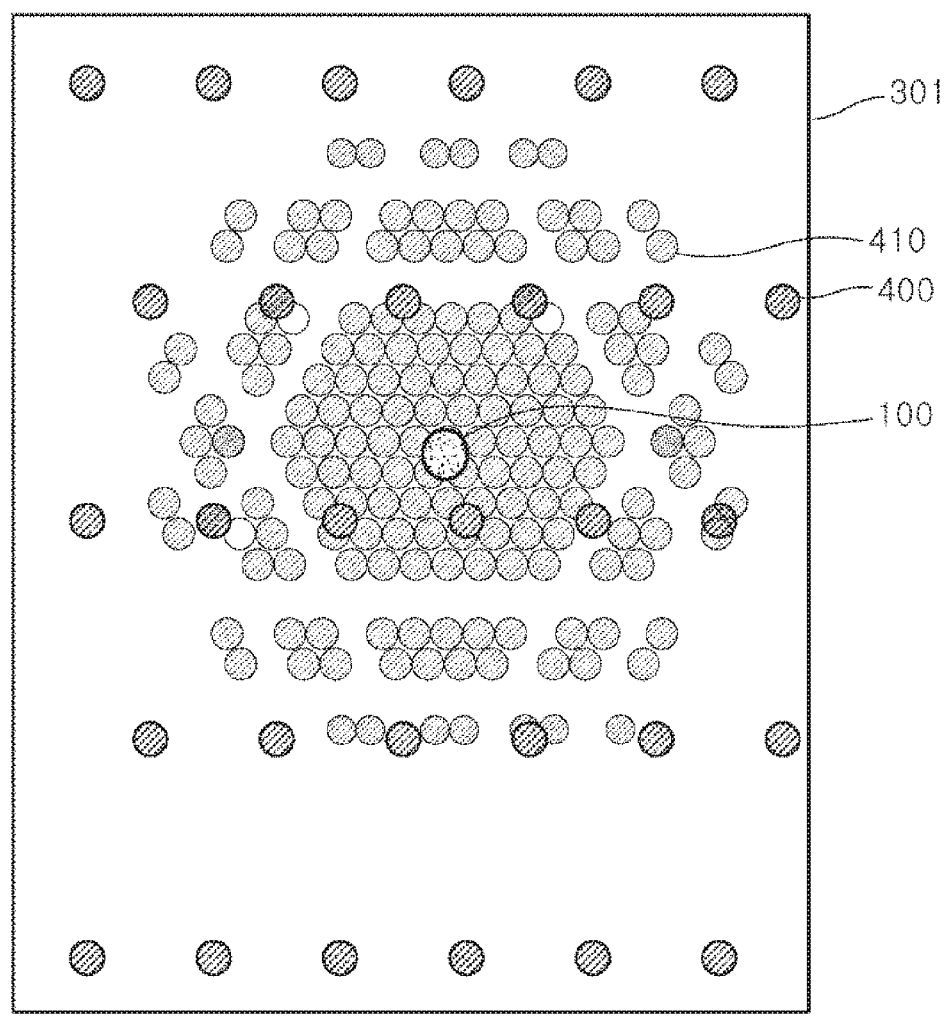

The imprinting process performed using the imprinting apparatus 10 will be described hereinafter with reference to FIGS. 2 to 11. FIG. 2 is a flowchart illustrating a method of forming imprinted patterns according to an embodiment. FIGS. 3 to 8 are simplified side views illustrating various steps of forming imprinted patterns according to the flowchart illustrated in FIG. 2. FIGS. 9 to 11 are plan views illustrating various imprint material drop maps used in the imprinting process performed according to the flowchart illustrated in FIG. 2.

Figure 3:
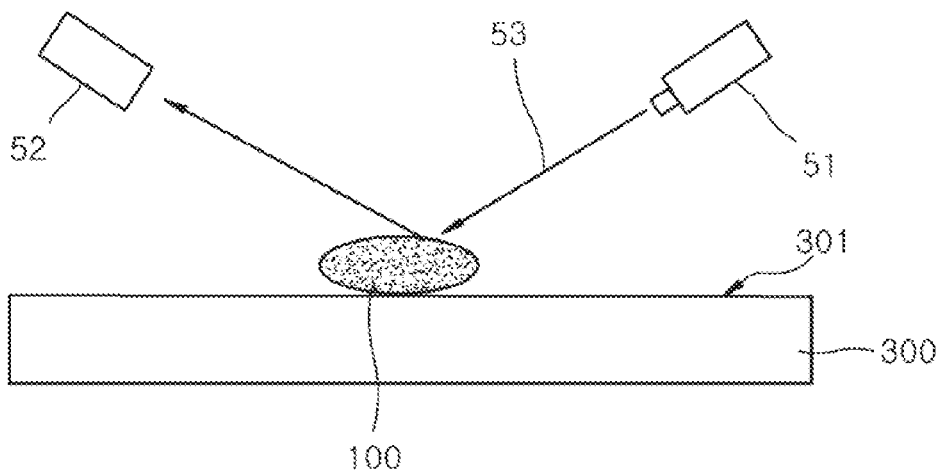
FIGS. 3 to 8 are simplified side views illustrating a method of forming imprinted patterns according to an embodiment.

Referring to FIGS. 2 and 3, a particle 100 on a surface 301 of a wafer 300 may be detected using the particle detector (50 of FIG. 1) (see a step S1 of FIG. 2). Specifically, the wafer 300 may be mounted on the wafer stage (32 of FIG. 1) of the imprinting apparatus (10 of FIG. 1), and the particle 100 on the surface 301 of the wafer 300 may be detected using the particle detector 50. The light emitter 51 may irradiate a detection light 53 onto the surface 301 of the wafer 300, and the light receiver 52 may receive the detection light 53 reflecting from the surface 301 of the wafer 300 to collect information on the particle 100. The detection light 53 may scan the surface 301 of the wafer 300 to verify whether the surface 301 of the wafer 300 is contaminated by contaminant, for example, the particle 100. In addition, the detection light 53 may scan the surface 301 of the wafer 300 to obtain information on a position of the particle 100. Moreover, the detection light 53 may scan the surface 301 of the wafer 300 to obtain information on a size and a volume of the particle 100 existing on the surface 301 of the wafer 300.

Figure 4:
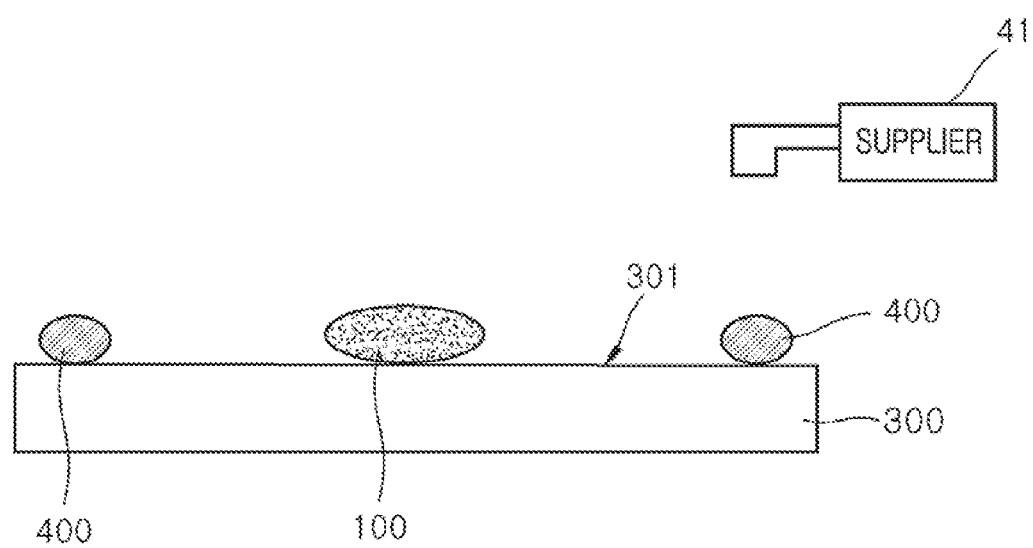

Referring to FIGS. 2 and 4, first droplets 400 of an imprint medium material may be formed on the surface 301 of the wafer 300 (see a step S2 of FIG. 2). The first droplets 400 may be formed on the surface 301 of the wafer 300 using the supplier (41 of FIG. 1) of the imprinting apparatus 10. The supplier 41 may generate the first droplets 400 according to a recipe provided by the first recipe generator 61. The first droplets 400 may be generated using an inkjet manner. In a subsequent process, the template (20 of FIG. 1) may be pressed down to spread the first droplets 400 and to form an imprint medium layer.

An array pattern of the first droplets 400 on the surface 301 of the wafer 300 may be illustrated in an imprint material drop map 501 of FIG. 9. The first recipe generator 61 of the imprinting apparatus 10 may generate the imprint material drop map 501 including information on positions and volumes of the first droplets 400 for forming an imprint medium layer on the surface 301 of the wafer 300 in a subsequent process. The first droplets 400 may be distributed on the surface 301 of the wafer 300 according to the information of the imprint material drop map 501 provided by the first recipe generator 61. In such a case, the information on the position of the particle 100 may not influence the generation of the imprint material drop map 501. According to the imprint material drop map 501, the first droplets 400 may be formed to be located at vertices of diamond-shaped tetragons which are two-dimensionally arrayed in a plan view. A volume size of each of the first droplets 400 and a distance between the first droplets 400 may be determined in consideration of a thickness of an imprint medium layer which is formed by spreading the first droplets 400 in a subsequent process.

The first recipe generator 61 may calculate and determine the positions and the volume size of the first droplets 400 using a thickness and a thickness distribution of the imprint medium layer as variables. The supplier 41 may distribute and form the first droplets 400 on the surface 301 of the wafer 300 according to the information of the imprint material drop map 501 including the determined positions and the determined volume size of the first droplets 400.

The wafer 300 may be a semiconductor wafer. Alternatively, the wafer 300 may be a dielectric substrate or a metallic substrate. The imprint medium material may be a material into which the imprinting patterns 21 of the template 20 can be carved or imprinted. The imprint medium material may include a resist material which can be cured by an exposure light such as a UV ray. If imprint medium material includes a resist material, the resist material may contain a photo initiator or a photosensitizer that reacts on the UV ray. The resist material may include a polymer material or a resin material. The resist material may include a polymer material which is polymerized from a monomer material such as an acrylate material or a methacrylate material. The resist material may include a material which can be polymerized by photo initialization. The curable resist material may further include an accentuator such as a dimethyl siloxane derivative material.

The resist material may have a viscosity which is lower than a viscosity of a thermoset resin and a thermoplastic resin which are used in a hot imprint lithography process. Thus, the resist material may move fast to quickly fill the recessed portions of the imprinting pattern 21 of the template 20 while the imprinting process is performed. Accordingly, the imprinting process can be performed at a low temperature and under a low pressure to improve the throughput in a formation process of fine patterns.

Figure 5:
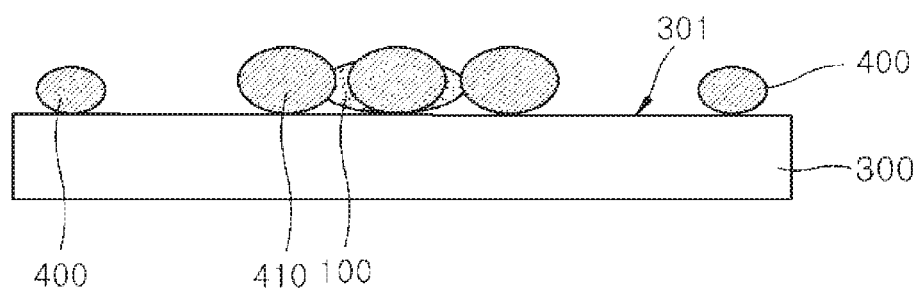

Referring to FIGS. 2 and 5, second droplets 410 of the imprint medium material may be additionally formed on the surface 301 of the wafer 300 (see a step S3 of FIG. 2). The second droplets 410 may be additionally formed on the surface 301 of the wafer 300 using the supplier 41 of the imprinting apparatus 10 illustrated in FIG. 1. The supplier 41 may generate the second droplets 410 according to a recipe provided by the second recipe generator 62. The second droplets 410 may be generated using an inkjet manner.

An array pattern of the second droplets 410 on the surface 301 of the wafer 300 may be illustrated in an additional imprint material drop map 502 of FIG. 10. The information on the particle 100 collected by the particle detector 50 of the imprinting apparatus 10 illustrated in FIG. 1 may be transmitted to the second recipe generator (62 of FIG. 1) of the recipe generator (60 of FIG. 1). The information on the particle 100 may include a position, a size and a volume of the particle 100 on the wafer 300. The second recipe generator 62 may generate the additional imprint material drop map 502 including information on an amount of the imprint material to be supplied onto the wafer 300 and information on positions of the second droplets 410 to be formed on the surface 301, on the basis of the information on the particle 100 collected by the particle detector 50. The additional imprint material drop map 502 may be generated such that the particle 100 is fully covered with and embedded in an imprint medium layer formed by spreading the first and second droplets 400 and 410 in a subsequent process.

The second recipe generator 62 may generate the additional imprint material drop map 502 including information on positions and volumes of the second droplets 410 to be formed on the surface 301 of the wafer 300. The additional imprint material drop map 502 may be generated using the information on the particle 100 such that the second droplets 410 are distributed on the surface 310 of the wafer 300 to cover the particle 100. The second droplets 410 may be distributed to be adjacent to or spaced apart from each other by certain distances which are less than a distance between the first droplets 400. The second droplets 410 may be supplied to have a volume size which is greater than a volume size of the first droplets 400. The second droplets 410 may be distributed to have an integration density which is higher than an integration density of the first droplets 400.

The second droplets 410 may be supplied to locally increase a thickness of an imprint medium layer adjacent to the particle 100. That is, the second droplets 410 may induce an imprint medium layer adjacent to the particle 100 to be thicker than an imprint medium layer far from the particle 100. The second droplets 410 may be provided to locally increase a thickness of an imprint medium layer formed by spreading the first and second droplets 400 and 410 in a subsequent process. As a result, an entire portion of the particle 100 may be substantially embedded in the imprint medium layer in a subsequent process. In some embodiments, a droplet adjacent to a particle 100 may be a droplet that is closer in proximity to the particle 100 than another droplet. In other embodiments, a droplet adjacent to a particle 100 may be a droplet that is in direct contact with the particle 100. In other embodiments, a droplet adjacent to a particle 100 may be a droplet that is in contact with the particle 100 through a single droplet or multiple droplets between the droplet and the particle 100. In an embodiment, a droplet adjacent to a particle 100 may include a droplet or droplets used to form a local portion 432 of the imprint medium layer 432 (i.e., see FIG. 7). In some embodiments, a droplet or layer that is adjacent to a particle may be a droplet or layer that is within a certain chosen distance from the particle.

Referring to FIGS. 5 and 11, a total array pattern of the first and second droplets 400 and 410 may be illustrated in a final drop map 503 of FIG. 11. The second droplets 410 adjacent to the particle 100 may be disposed to have a relatively high density as compared with the first droplets 400.

Figure 6:
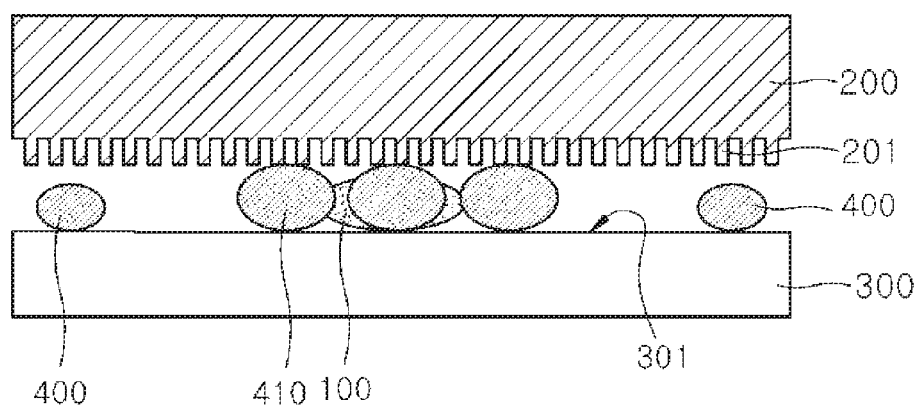

Referring to FIG. 6, a template 200 corresponding to the template 20 of FIG. 1 may move toward the wafer 300 to contact the first and second droplets 400 and 410. The template 200 may be lowered toward the wafer 300 by the template drive stage 25 of the imprinting apparatus 10. If the template 200 is lowered toward the wafer 300, an imprinting pattern 201 (corresponding to the imprinting pattern 21) of the template 200 may be in contact with the first and second droplets 400 and 410. If the template 200 is additionally pressed down, the first and second droplets 400 and 410 may be spread to form an imprint medium layer 430 between the template 200 and the wafer 300 (see a step S4 of FIG. 2).

As the first and second droplets 400 and 410 are spread in a space between the template 200 and the wafer 300, the recessed portions of the imprinting pattern 201 may be filled with the imprint material of the first and second droplets 400 and 410. Therefore, a feature of the imprinting pattern 201 may be transferred to the imprint medium layer 430.

Figure 7:
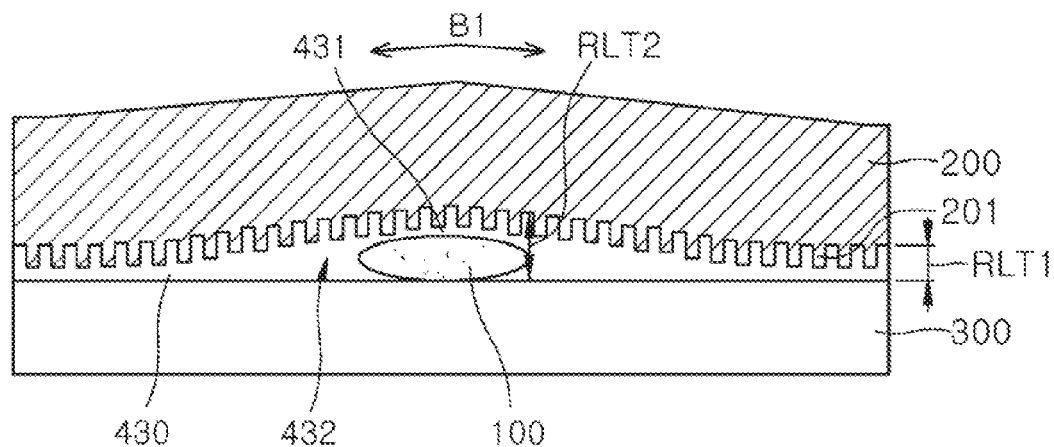

If only the first droplets 400 were formed on the wafer 300 without the second droplets 410, the imprint medium layer 430 would be uniformly formed on the wafer 300 to have a first thickness (RTL1 of FIG. 7). As illustrated in the imprint material drop map 501 of FIG. 9, the first droplets 400 are regularly arrayed on the wafer 300 such that distances between the first droplets 400 are the same. Thus, if only the first droplets 400 were spread without the second droplets 410 to form the imprint medium layer 430, the imprint medium layer 430 would be uniformly formed on the wafer 300 to have a first thickness RTL1.

As illustrated in the additional imprint material drop map 502 of FIG. 10, the second droplets 410 may be non-uniformly formed on the wafer 300 and may be locally distributed on the wafer 300. That is, since the second droplets 410 are intensively distributed to be adjacent to the particle 100, an amount of the imprint medium material supplied onto a portion (adjacent to the particle 100) of the wafer 300 is more than an amount of the imprint medium material supplied onto the other portions of the wafer 300. Thus, a total volume of the first and second droplets 400 and 410 supplied adjacent to the particle 100 may be larger than a total volume of the first and second droplets 400 and 410 supplied far from the particle 100. Accordingly, after the template 200 is pressed down to form the imprint medium layer 430, a second thickness RTL2 of the imprint medium layer 430 formed to be adjacent to the particle 100 may be greater than the first thickness RTL1 of the imprint medium layer 430 formed to be far from the particle 100. That is, the second droplets 410 may induce a portion of the imprint medium layer 430 formed to be adjacent to the particle 100 to be thicker than the other portion of the imprint medium layer 430 formed to be far from the particle 100.

Since a portion of the imprint medium layer 430 formed to be adjacent to the particle 100 is thicker than the other portion of the imprint medium layer 430 formed to be far from the particle 100, an entire portion of the particle 100 may be fully embedded in the imprint medium layer 430. Thus, a portion of the imprint medium layer 430 may exist between the particle 100 and the template 200 to act as a buffer portion 431. The buffer portion 431 comprised of the imprint medium material may relieve or alleviate a stress generated between the particle 100 and the template 200. The buffer portion 431 may alleviate the stress locally and excessively applied to the template 200 due to the presence of the particle 100. Thus, the buffer portion 431 may effectively suppress that the template 200 is damaged by the particle 100.

Figure 12:
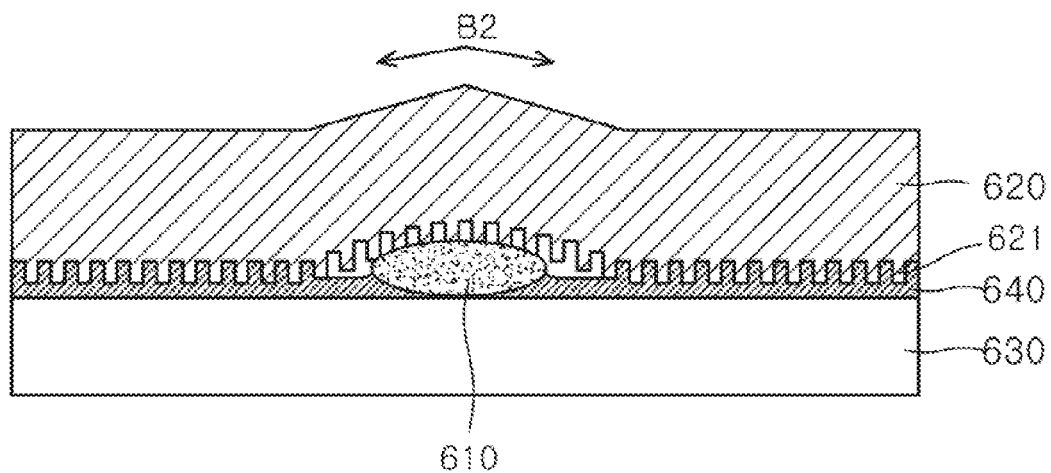
FIG. 12 is a simplified side view illustrating a template damaged by a particle.

FIG. 12 is a simplified side view illustrating a template 620 damaged by a particle 610. FIG. 12 illustrates an example in which the step S3 of FIG. 2 is omitted.

Referring to FIG. 12, if the particle 610 exists on a wafer 630, the particle 610 may not be fully embedded in an imprint medium layer 640 which is formed by pressing down the template 620. In the event that a thickness of the imprint medium layer 640 is less than a height of the particle 610, a portion of the particle 610 may be exposed to protrude from a surface of the imprint medium layer 640. Thus, the particle 610 may be in direct contact with the template 620 without the imprint medium layer 640 between the particle 610 and the template 620. In such a case, a strong force may be directly applied to the particle 610 by the template 620 which is pressed down toward the wafer 630. Accordingly, the template 620 may locally and sharply warp to cause a stress B2 applied to the template 620. As a result, the template 620 may be damaged by the stress B2 which is applied to the template 620 due to the particle 610. In addition, the particle 610 may be in direct contact with an imprinting pattern 621 of the template 620 to cause damage of the imprinting pattern 621.

In contrast, as illustrated in FIG. 7, the buffer portion 431 may prevent the particle 100 from being in direct contact with the template 200. The buffer portion 431 may alleviate the warpage of the template 200 to reduce an intensity of a stress B1 applied to the template 200. A local portion 432 of the imprint medium layer 430 adjacent to the particle 100 may have the second thickness RTL2 which is greater than a thickness of the other portions of the imprint medium layer 430. The local portion 432 of the imprint medium layer 430 may alleviate the warpage of the template 200 and may reduce an intensity of the stress B1 applied to the template 200. Since the buffer portion 431 is located between the particle 100 and the template 200, the template 200 may not be in direct contact with the particle 100. In addition, the imprinting pattern 201 of the template 200 may not be in direct contact with the particle 100. Hence, the buffer portion 431 may prevent the template 200 or the imprinting pattern 201 of the template 200 from being damaged by the particle 100. As a result, a life time of the template 200 may be improved.

Referring again to FIG. 7, while the template 200 is in contact with the imprint medium layer 430, the imprint medium layer 430 may be cured using the illuminator (70 of FIG. 1) of the imprinting apparatus (10 of FIG. 1) (see a step S5 of FIG. 2). For example, the illuminator 70 may generate an UV ray and may irradiate the UV ray to the imprint medium layer 430. Thus, the imprint medium layer 430 may be cured by the UV ray. As a result, a feature of the imprinting pattern 201 of the template 200 may be transferred to the imprint medium layer 430.

Figure 8:
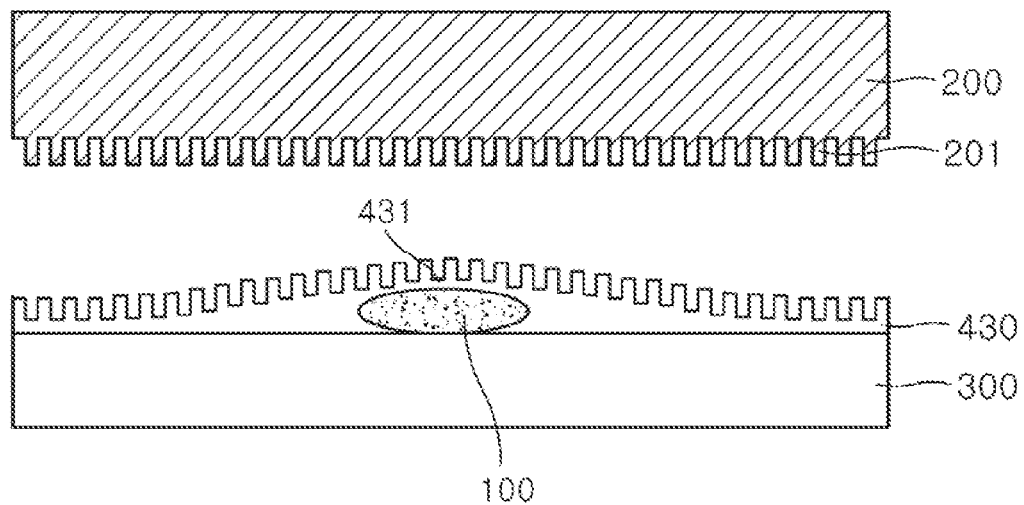

Referring to FIG. 8, the template 200 may be detached from the imprint medium layer 430 which is cured using the illuminator 70. (see a step S6 of FIG. 2). For example, the template 200 may be lifted up by the template drive stage (25 of FIG. 1) to separate the template 200 from the imprint medium layer 430.

According to the present disclosure described above, the second droplets 410 may be supplied onto the wafer 300 to be adjacent to the particle 100 on the wafer 300 to increase the second thickness RTL2 of the local portion 432 of the imprint medium layer 430, which is adjacent to the particle 100. In such a case, the local portion 432 having the second thickness RTL2 may be formed to be thicker than the particle 100. Thus, the particle 100 may be totally embedded in the local portion 432 of the imprint medium layer 430. Accordingly, the local portion 432 may prevent the particle 100 from being in direct contact with the template 200. As a result, the local portion 432 may suppress that the template 200 is damaged by the particle 100. The buffer portion 431 between the particle 100 and the template 200 as well as the local portion 432 adjacent to the particle 100 may relieve or alleviate elastic deformation of the template 200. According to the present disclosure, whereas only the second thickness RTL2 of local portion 432 of the imprint medium layer 430 adjacent to the particle 100 increases, the other portion of the imprint medium layer 430 may be formed to maintain the first thickness RTL1 which is less than the second thickness RTL2. The first thickness RTL1 may correspond to a thickness of the imprint medium layer 430 formed to be far from the particle 100.

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method of forming imprinted patterns, the method comprising:
    detecting a particle located on a wafer;
    distributing an imprint medium material on a surface of the wafer, wherein distributing the imprint medium material on the surface of the wafer comprises:
    forming first droplets of the imprint medium material on the surface of the wafer;
    and forming second droplets of the imprint medium material at positions adjacent to the particle on the surface of the wafer; and
    forming an imprint medium layer on the surface of the wafer with a template and the imprint medium material,
    wherein the imprint medium layer has a first thickness and a second thickness greater than the first thickness, and the second thickness is closer in proximity to the particle than the first thickness, and
    wherein the first thickness is less than a height of the particle.

2. The method of claim 1, wherein distances between the second droplets of the imprint medium material are less than a distance between the first droplets of the imprint medium material.

3. The method of claim 1, wherein each of the second droplets of the imprint medium material is formed to have a volume size which is greater than a volume size of each of the first droplets of the imprint medium material.

4. The method of claim 1, wherein the second droplets of the imprint medium material are formed such that an integration density of the second droplets is greater than an integration density of the first droplets.

5. The method of claim 1, wherein forming the imprint medium layer on the surface of the wafer includes spreading the first and second droplets by pressing down the template toward the wafer.

6. The method of claim 1, wherein the imprint medium layer is formed such that a portion of the imprint medium layer adjacent to the particle is thicker than the other portion of the imprint medium layer farther from the particle than the imprint medium layer adjacent to the particle due to the second droplets of the imprint medium material.

7. The method of claim 1, wherein the imprint medium layer is formed such that a local portion of the imprint medium layer adjacent to the particle fully embeds an entire portion of the particle due to the second droplets of the imprint medium material.

* * * * *